United States Patent
Garnett (10) Patent No.: US 6,967,487 B2
(45) Date of Patent: Nov. 22, 2005

(54) DISTRIBUTED DIODE FAULT CHECK (75) Inventor: Paul J. Garnett, Camberley (GB)

(73) Assignee: Sun Microsystems, Inc., Santa Clara, CA (US)

( * ) Notice: Subject to any disclaimer, the term of this patent is extended or adjusted under 35 U.S.C. 154(b) by 156 days.

(21) Appl. No.: 10/455,753

(22) Filed: Jun. 4, 2003

(65) Prior Publication Data
US 2004/0042145 A1 Mar. 4, 2004

(30) Foreign Application Priority Data
Jun. 6, 2002 (GB) .............................. 0212994

(51) Int. Cl.$^7$ ..................... H01H 31/02; G08B 29/00
(52) U.S. Cl. .................. 324/537; 324/158.1; 324/767; 340/514; 340/635; 340/650
(58) Field of Search ................. 324/158.1, 767, 324/537; 340/635, 645, 650, 652, 657, 660, 664, 514

(56) References Cited

U.S. PATENT DOCUMENTS 3,679,970 A    7/1972  Winters et al.
5,325,062 A *  6/1994  Bachand et al. ............ 324/537
6,157,308 A   12/2000  Byers
6,342,791 B1 * 1/2002  Ichikawa et al. ........... 324/767
6,462,667 B1 * 10/2002 Menard ....................... 340/660

FOREIGN PATENT DOCUMENTS

EP    0690542    9/1999
GB    2389471    12/2003

* cited by examiner

Primary Examiner—Vincent Q. Nguyen
(74) Attorney, Agent, or Firm—Meyertons Hood Kivlin Kowert & Goetzel, P.C.; B. Noël Kivlin (57) ABSTRACT A method and apparatus for testing for latent faults in the isolation devices of a system including redundant power supplies which supply power to one or more system units. A system controller is operable to perform a test cycle to perform the fault checks, which may including checks for short circuits and/or open circuits. The checks may be performed within a test cycle in which each of the isolation devices in the system is tested. The test cycle may be performed at regular intervals, the interval between each cycle being determinable by user input. In the event that a fault in one of the isolation devices is detected, the system controller may be operable to report the fault to an alarm system.

31 Claims, 5 Drawing Sheets

DISTRIBUTED DIODE FAULT CHECK

BACKGROUND OF THE INVENTION

The present invention relates to redundant power supply systems. In particular, the invention relates to a method and apparatus for testing for faults in the isolation circuits of systems powered by redundant power supplies.

It is customary in redundant power supply systems to provide a number of isolation devices, which serve to isolate inoperative power supplies from any unwanted backflow of current. The inoperative state in one (or more) of the power supplies may be intentional or alternatively may occur due to a malfunction.

Due to the nature of their operation, it is inherently the case that the presence of certain types of faults in isolation devices (such as a short circuit) only become apparent when the power supply which it serves to isolate becomes inoperative. A latent fault in an isolation device may therefore develop while the associated power supply is in the operative state and remain undetected until that power supply becomes inoperative.

However, it is in the inoperative state that each power supply relies upon its associated isolation devices for protection from the backflow of current. Should it remain undetected, the development of a latent fault in an isolation device has potentially disastrous consequences, which may lead to catastrophic failure in its associated power supply or in other power supplies in the system.

Therefore, it is desirable to be able to test the integrity of each isolation device 'before the event', while each associated power supply is in the operative state, thereby ensuring the protection of each power supply from unwanted backflow currents in the inoperative state.

SUMMARY OF THE INVENTION

An aspect of the present invention can provide a fault test method for use in a system comprising one or more system units. Each system unit may comprise at least two isolation devices and be powered by a plurality of redundant power supplies. Each isolation device requires a forward biasing voltage at least equal to a respective forward bias voltage value to be operable in a normal conductive state. Each isolation device can be electrically connected with a respective one of the power supplies such that each power supply has associated with it a set of one or more isolation devices. An output of each isolation device can be connected to a common load of the corresponding system unit. The fault test method can be performed by a testing system and include:

selecting as a subject for a test procedure, the set of isolation devices associated with a corresponding one of the power supplies;

controlling the power supplies during the test procedure to marginally vary an output voltage of at least one power supply such that a differential voltage is applied between an output of the power supply associated with the selected set of isolation devices and outputs of the remaining power supplies for selectively changing the conductive state of at least one isolation device by reducing the forward voltage thereof to less than said respective forward bias voltage;

measuring the current through each isolation device in said selected set of isolation devices; and determining whether each measured current is consistent with the existence of a fault condition in the respective isolation device.

By employing the method described here, the system controller is thereby able to check for fault conditions in each isolation device in a selected set of isolation devices, the set being associated with a corresponding power supply. The isolation devices of a power supply system may thus be tested for latent faults during normal operation, and while each power supply associated with those isolation devices is in the operative state.

Another aspect of the present invention can provide a system that comprises one or more system units. Each system unit may include at least two isolation devices and measuring circuitry for measuring the current through those isolation devices. Each isolation device requires a forward biasing voltage at least equal to a respective forward bias voltage value to be operable in a normal conductive state. Each isolation device can have an output connected to a common load of the respective system unit. The system can further include a plurality of redundant power supplies. Each power supply can supply power for at least one system unit via an isolation device of the respective system unit. Each power supply thereby can have associated with it a set of one or more isolation devices. Each power supply can also comprise control circuitry operable to control an output voltage of that power supply. The system controller can be operable to:

select as a subject for a test procedure, the set of isolation devices associated with a corresponding one of said power supplies;

cause at least one power supply to marginally vary an output voltage thereof such that a differential voltage is applied between an output of the power supply associated with the selected set of isolation devices and outputs of the remaining power supplies for selectively changing the conductive state of at least one isolation device by reducing the forward voltage thereof to less than said respective forward bias voltage, and determine whether the current measured by said measuring circuitry through each isolation device in said selected set of isolations devices is consistent with the existence of a fault condition in the respective isolation device.

BRIEF DESCRIPTION OF THE DRAWINGS

For a better understanding of the invention and to show how the same may be carried into effect reference is now made by way of example to the accompanying drawings in which.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims. In this regard, it is envisaged that combinations of features from the independent claims with features of dependent claims other than as presented by the dependencies of the claims, and also with features from the description, is also envisaged.

DESCRIPTION OF PARTICULAR EMBODIMENTS

Figure 1:
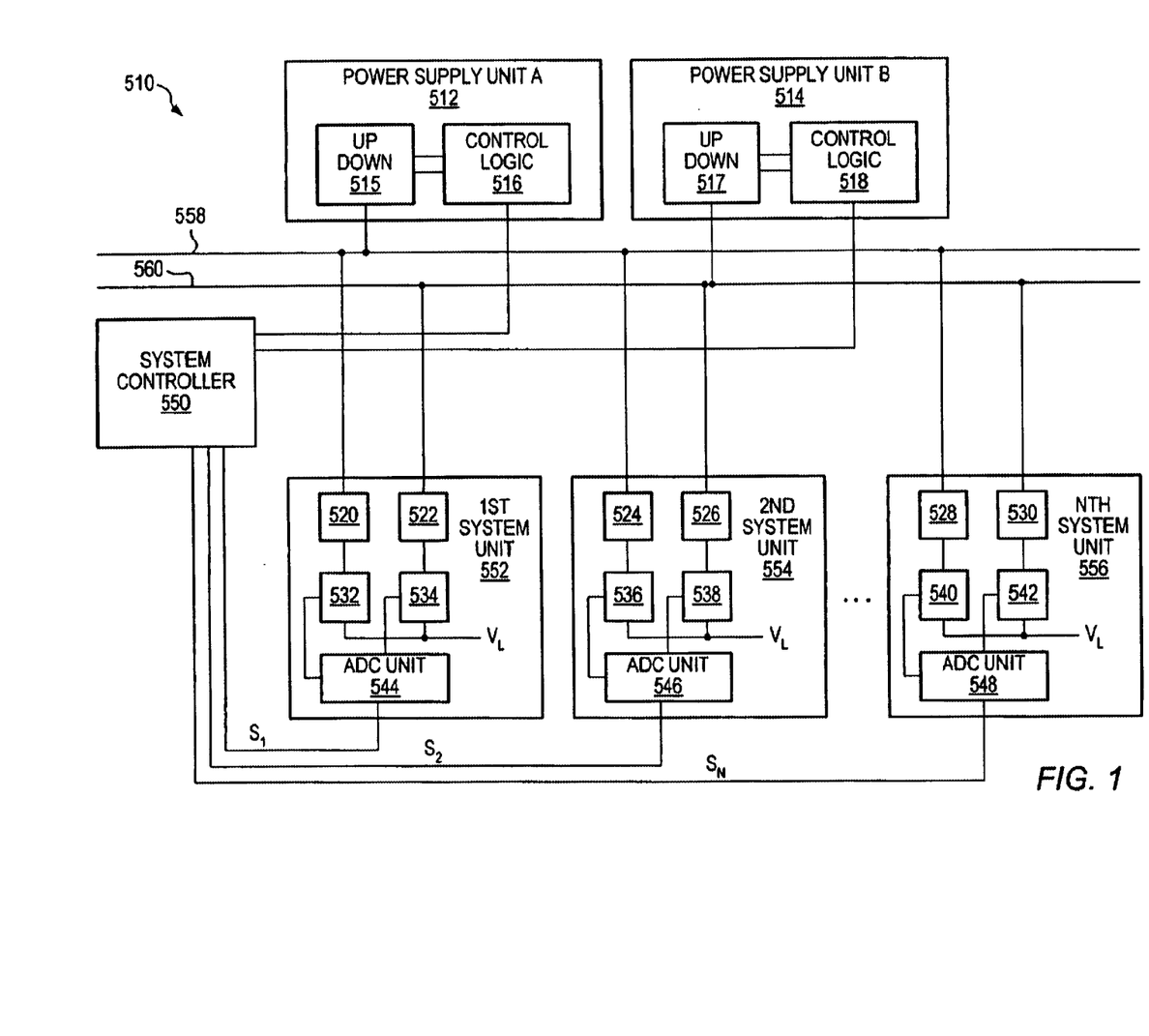
FIG. 1 shows a system comprising two power supplies, a system controller and N system units in accordance with an embodiment of the present invention.

FIG. 1 illustrates a power supply system 510 in which a number of system units 552, 554, 556 can be powered by two power supply units 512, 514. Power can be supplied to each system unit via common power rails 558 and 560. According to this arrangement, each power supply can be provided with a respective power rail whereby the number of power rails is equal to the number of power supplies.

The power supply unit 512 can comprise control logic 516, which receives control signals from system controller 550. These control signals can be indicative of a desired output voltage for the power supply, as determined by the system controller 550. Control logic 516 can be operable to supply a logic level input circuit 515, referred to hereinafter as a margin arm 515, with logic signals 'up' and 'down' in accordance with the desired output voltage. The margin arm 515 can be operable to incrementally increase or decrease the output voltage presented by the power supply 512 in accordance with the logic signals received from the control logic 516.

The power supply unit 514 can comprise components corresponding to those described in relation to the power supply unit 512. In the case where more than two power supplies are present, it is anticipated that those further power supplies could also comprise such components.

In operation, the system unit 520 can be connected to a power rail 558 and a power rail 560 whereby power from both of the power supplies 512, 514 can be received. The power supply unit 552 comprises two isolation devices 520 and 522, both of which only conduct current in one direction. The isolation device 520 thereby isolates the power rail 558 from a backflow of current from the system unit 552 (and thereby protects each power supply or system unit connected to that rail). Similarly, the isolation device 522 isolates the power rail 560. In the embodiments described herein, each isolation device can comprise a diode, although any arrangement of components which can imposes the condition of unidirectional current flow could be employed.

Sensing circuits 532 and 534 can be connected in parallel with isolation devices 520 and 522 respectively and are operable to determine the magnitude and direction of current flowing through those isolation devices. The sensing circuits can be provided within the system unit 552, although in alternative implementations of the invention, they may be provided externally. In either case, the sensing circuits 532 and 534 can be provided either 'upstream' or (as indicated in FIG. 1) 'downstream' of the respective isolation devices 520 and 522.

In the arrangement shown in FIG. 1, the currents flowing through the isolation devices 520 and 522 both supply a common load presented by the electrical components of the system unit.

An analogue to digital converter (ADC) unit 544 can be operable to receive analogue signals from each of the sensing circuits 532 and 534. These signals can be indicative of the currents flowing into (or indeed out of) system unit 552 from respective power rails 558 and 560. The signals can be converted into a digital signal S1 that can be supplied to the system controller 550. The system controller is thereby able to monitor the currents supplying the system unit 552.

Each additional system unit, from the $2^{nd}$ system unit 554 up to and including the Nth system unit 556 can comprises components corresponding to those described in relation to system unit 552 and can be arranged in an analogous fashion with respect to the power rails 558 and 560. Accordingly each power rail can be supplied by a single power supply and can supply power to N system units. Each system unit can receive a portion of its total power supply from each power rail.

The system controller 550 can be operable to perform a test cycle that tests for latent faults in the isolation devices of one or more of the system units. The system unit 550 may be connected to an alarm system for reporting the detection of such latent faults. Broadly speaking, this test cycle can comprise marginally varying the output voltages of one or more of the power supplies so as to observe the current flowing through each isolation device in the presence of various voltage conditions.

Before describing the test cycle in more detail, it will be useful to consider the characteristics of semiconductor isolation devices (such as a diode) used in the context of this invention.

As described above, an isolation device will, at least, in the absence of faults, only conduct current in a single direction. This unidirectional current flow behavior is associated with a 'switch-on' or biasing voltage $V_B$, which is a characteristic of the device. For positive forward voltages $V_F \geq V_B$ applied across the input and output of an isolation device, a positive current $I = I_F$ passes through the device. Another characteristic of semiconductor isolation devices is that they present minimal resistance to current flow when forward biased. Consequently, when forward biased, the value of $V_F$ is substantially equal to $V_B$ for essentially all useful values of forward current $I = I_F$. A typical switch-on voltage for a semiconductor diode is $V_B \approx +0.6V$.

For values of $V_F$ lower than $V_B$, the resistance of an isolation device increases abruptly to an essentially semi-infinite value. Consequently, the current flowing through the device falls to zero. The output characteristics of a typical isolation device can be as indicated in Table 1 below:

TABLE 1

Figure 2:
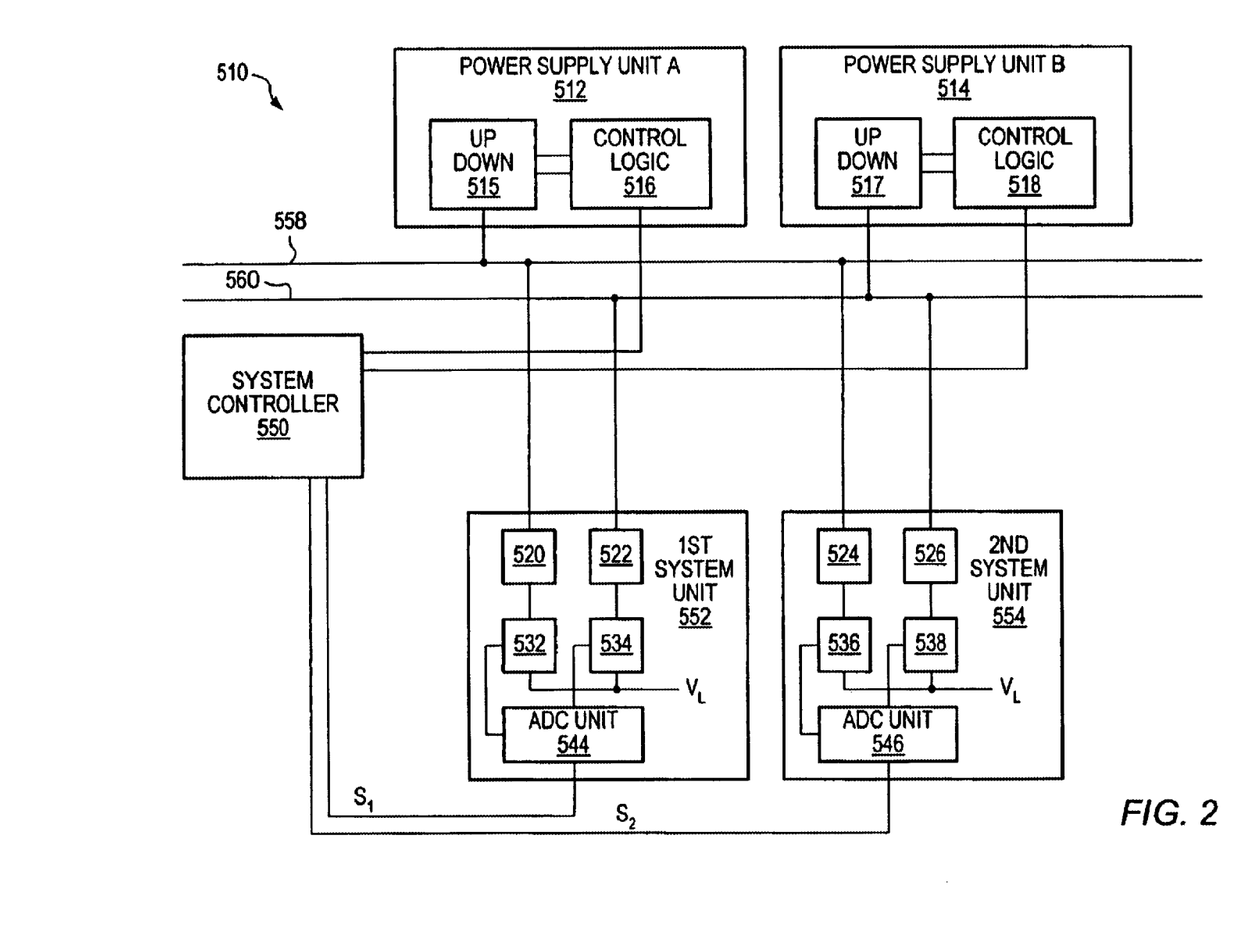
FIG. 2 shows a system comprising two power supplies, a system controller and two system units in accordance with an embodiment of the present invention.

$V \geq V_B \Rightarrow I = I_F > 0 \ \& \ V = V_F \approx V_B$
$V < V_B \Rightarrow I = 0.$ The test cycle performed by the system controller 550 will now be described in relation to a system comprising two power supply units 512, 514 and two system units 552, 554 (i.e. N=2). This system 510 is shown in FIG. 2. In FIG. 2, the same reference symbols are used to denote integers analogous to those of the generalized system 510 shown in FIG. 1.

The first step in the test cycle comprises selecting the set of isolation devices associated with a given one of the power supplies 512, 514 and corresponding power rail 558, 560. In the present example, the set of isolation devices associated with the power supply 512 and the power rail 558 are selected (namely isolation devices 520 and 524). It is envisaged however that no particular order of selection need be imposed. Having selected a set of isolation devices, phase one of the test cycle may proceed.

In the first phase of the test cycle, the selected set of isolation devices is tested for short circuits. Should a short circuit be present in an isolation device, the output characteristics set out above would alter such that current is able to flow in the direction opposite to $I_F$. As described previously, this has potentially disastrous consequences since under certain conditions (such as those described below) current may flow back through a shorted device and onto the common power rail. This common power rail is shared by a power supply unit and a number of other system units (one, in the system of FIG. 2) and a backflow of current may damage those devices.

During normal operation, it is assumed that each power supply outputs a supply voltage substantially equal to $V_S$. To test the selected set of isolation devices, the system controller can control the power supply unit 512 to reduce its supply voltage such that the voltage on the power rail 558 decreases from usual operational value $V_S$ to value $V_{S1}$ with $V_{S1}<V_S$. The system controller 550 can also control the remaining power supplies in the system 510 (in this case these comprise a single unit, namely power supply unit 514) to increase their supply voltages such that the voltage appearing on the remaining power rails (560) increases from $V_S$ to $V_{S2}$ with $V_{S2}>V_S$. The values of $V_{S1}$ and $V_{S2}$ are such that the absolute decrease in voltage on the power rail 558 is equal to the absolute increase in voltage on the power rail 514:

This is represented in Table 2 below:

TABLE 2

| Power Rail 558: | $V \rightarrow V_{S1} = V_S - V_D/2$ |
| Power Rail 560: | $V \rightarrow V_{S2} = V_S + V_D/2$. |

The difference in voltage between power rail 558 and power rail 560 is therefore equal to $V_D$, i.e. $V_{S2}-V_{S1}=V_D$.

Under these conditions, the common load of each system unit 552, 554 is supplied primarily by power supply 514 whose supply voltage is higher than that of the power supply 512. Consequently, the common load voltage $V_L$ in each system unit 552, 554 is expected to increase. Accordingly, while the input voltage at each of the selected set of isolation devices is reduced to $V_{S1}$, the voltage at the outputs of those devices is increased and therefore the respective bias voltages are decreased. In accordance with the test procedure, incremental change $V_D$ is in fact chosen such the bias voltage V across each of the selected isolation devices falls to a value lower than $V_B$. Accordingly, it is expected that the current flowing through each of the selected set of isolation devices (in the absence of latent faults) should fall to zero.

If, however a short circuit fault exists in any of the selected set of isolation devices, then a negative current (where a positive current refers to a flow of current from a power supply to a system unit) will be expected to flow (in the absence of faults in the remaining power supplies and isolation devices) through that (those) faulty device(s) since the load voltage $V_L$ exceeds $V_{S1}$. Should such negative currents appear, they can be sensed by a respective sensing circuit.

Accordingly, having controlled the power supplies in the system to vary their supply voltages in the manner described above, the system controller 550 can determine from signals $S_1$ and $S_2$ whether any of the isolation devices in the selected set are short circuited.

The test procedure then enters a second phase in which each of the selected set of isolation devices are tested for open circuit faults. In this phase, the system controller 550 can control the power supply 512 associated with the selected set of isolation devices 520, 524 to increase its supply voltage to a level higher than the normal operational supply voltage $V_S$. The controller 550 can also control the remaining power supplies 514 to decrease their supply voltage below $V_S$. During this second phase, the voltage conditions can be as set out in Table 3 below:

TABLE 3

| Power Rail 558: | $V \rightarrow V_{S1} = V_S + V_D/2$ |
| Power Rail 560: | $V \rightarrow V_{S2} = V_S - V_D/2$. |

The difference in voltage between the power rail 558 and the power rail 560 is therefore equal to $-V_D$, i.e. $V_{S2}-V_{S1}=-V_D$.

Under these conditions, it is expected that the currents passing through each of the isolation devices 522, 526 other than the selected set of isolation devices 520, 524 should (in the absence faults) fall to zero. Consequently, the common load voltage $V_L$ in each isolation device is expected to be supplied only by the power supply 512. However, should an open circuit fault exist in any of the selected set of isolation devices 520, 524, then it is expected that no current will flow through that (those) faulty device(s). A lack of current flow of this kind can be detected by a respective sensing circuit and communicated to the system controller 550 via a respective ADC unit 544, 546.

In the case that one or more faults are detected, the system controller 550 is operable to report to an alarm system (not shown). The system controller 550 may be operable to provide the alarm system with details of which system unit(s) 552, 554 contain faults and more particularly which isolation devices 520, 522, 524, 526 are involved. The system controller can also be operable to indicate the type of fault that has been detected (e.g. short circuit, open circuit). The alarm system can be operable to provide some form of indication to a user of the detected fault(s).

The test procedure described above can be repeated for each set of isolation devices in the system 510, whereby the test cycle is completed. System controller 550 may be operable to perform a further test cycle after the completion of some form of delay interval. The length of the delay interval may be determined in a number of different ways. For example, system controller may comprise some form of internal clock and means for storing a delay interval indicator. A mechanism may also be provided by which a user is able to select the indicator whereby the user can decide upon a suitable delay interval. Alternatively the system controller 550 may be operable to receive an external control signal indicating that a test cycle should be commenced. Such a control signal may for example originate in one of the system units. Means may also be proved by which a user is able to cause the system controller 550 to initiate a test cycle immediately.

The amplitude of the differential voltage $V_D$ can be selected by considering the characteristic bias voltages $V_B$ of the isolation devices 520, 522, 524, 526 in the system. In the system 510, similar isolation devices can be used in each of the system units 544, 554. Accordingly, there is a substantially uniform value of $V_B$ for each of the isolation devices in the system 510.

During the first phase of the test procedure, the bias voltage across each of the selected set of isolation devices 520, 524 can be reduced to a value lower than the characteristic bias voltage $V_B$ as represented in Table 4 below:

TABLE 4

$V < V_B$.

In the case where one of the selected set of isolation devices is the only functioning isolation device in the respective system unit (the remaining isolation devices in the system unit may for example have open circuit faults), this may give rise to an unacceptable drop in common load voltage $V_L$ in that system unit. Such a drop may, for example, mean that insufficient current is supplied to the components of the system unit. To avoid such an occurrence, it is required that the common load voltage remains above some minimum acceptable voltage $V_{min}$. This requires a relationship as represented in Table 5 below:

TABLE 5

$V_S - \frac{1}{2}V_D - V_B \geq V_{min}$

In Table 5, $V_S$ is the normal (unmodified) supply voltage on the power rails 558 and 560, $\frac{1}{2}V_D$ is the drop in that supply voltage in accordance with that phase of the test procedure, and $V_B$ is the characteristic voltage drop across the isolation device while that device is forward biased (and thereby allowing current to flow). Note that the value of $V_{min}$ is determined according to a 'worst case scenario' where the selected isolation device is the only operational (i.e. passing current) isolation device in that system unit.

Accordingly, the value of $V_D$ is given by the relationship in Table 6 below:

TABLE 6

$V_D \leq 2(V_S - V_{min} - V_B)$.

The calculation of $V_D$ should also take account of resistive losses in the power rails, statistical variations in the values of the bias currents $V_B$ for the isolation devices in the system 510 and other system tolerances such as deviations in the supply voltages from the nominal set value. Since these variables will be dependent on a given system, the optimum voltage may for instance be determined empirically using a dummy load.

In the example test procedure described above, the differential voltage $V_D$ is created by varying the supply voltage of the power supply associated with the selected set of isolation devices and varying the supply voltage of the remaining power supplies in the opposite sense. Alternatively, $V_D$ may be created by varying only the power supply associated with the selected set of isolation devices while keeping the supply voltages of the remaining power supplies constant. In a further alternative the supply voltage of the power supply associated with the selected set of isolation devices is kept constant while the supply voltages of the remaining power supplies are varied.

In the embodiments shown in FIGS. 1 and 2, system 510 comprises two power supply units 512;514. However, it is also envisaged that any number of power supply units may be present. An example of this is illustrated by the embodiment shown in FIG. 3. In this embodiment, the system 510 comprises three power supply units 512, 514, 590. As described above, the additional power supply unit 590 comprises components analogous to those present in the other two power supply units. Accordingly, power supply unit 590 can comprise control logic 592 and a margin arm 591.

Figure 3:
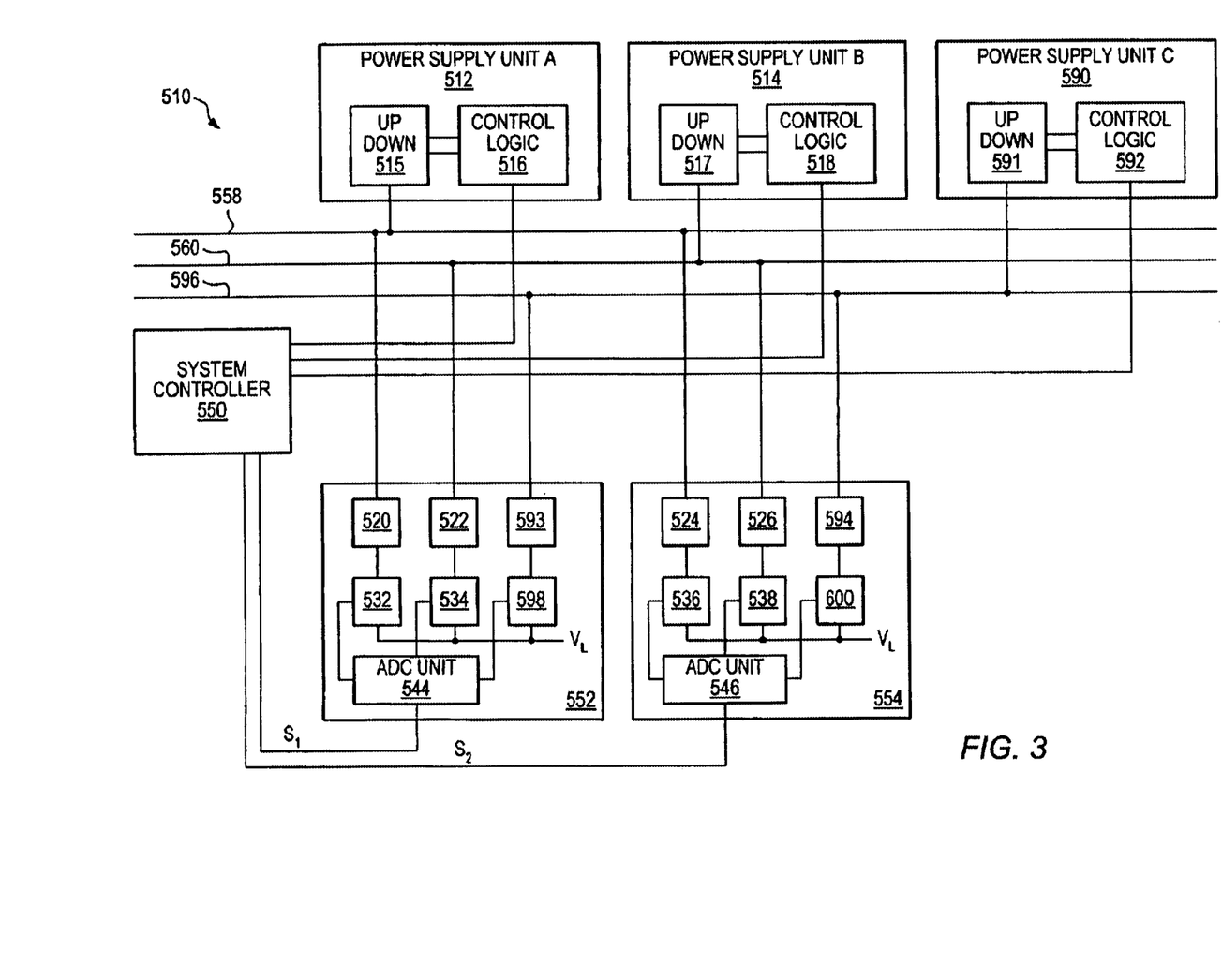
FIG. 3 shows a system comprising three power supplies, a system controller and two system units in accordance with an embodiment of the present invention.

In accordance with the topology described in relation to the generalized system shown in FIG. 1, the system shown in FIG. 3 can comprises an additional power rail 596 which provides power to each of the system units 552;554. In this embodiment, each system unit can receive power from each of the power supply units 512, 514, 590 via respective power rails 558, 560 and 596. Each system unit can comprise three isolation devices, each for isolating a respective one of the power rails from a backflow of current and the currents passing through those isolation devices may be sensed by respective sensing circuits.

The addition of power supply units in this type of system involves the introduction of additional sets of isolation devices. Accordingly, for each additional power supply included, two additional test phases (namely one additional short circuit test and one additional open circuit test) are employed for a full test cycle.

Considerations for choosing between the variety of possible test cycle procedures available for a given system topology will now be discussed. While in the test cycle described above in relation to the system in FIG. 2, each set of isolation devices were tested separately, it is in fact possible to simplify the test procedure. Examples of suitable simplifications, which can be of particular benefit to systems comprising multiple power supply units, are described below.

In a system comprising two power supply units, it is in fact possible to halve the number to test phases required by performing short circuit and open circuit tests simultaneously. Referring once more to FIG. 2 for instance, while the system controller 550 is performing a short circuit test on the a first set of isolation devices (for example 520, 524), it may simultaneously perform open circuit tests on the other set of isolation devices (522, 526). Similarly, when the first set of isolation devices (520, 524) are being tested for open circuits, the other set of isolation devices (522, 526) may be tested for short circuits. This is possible because the voltage conditions which are applied during a short circuit test for on set of isolation devices (namely the lowering/raising of the input voltages applied by an amount $V_D/2$) are the same voltage conditions which are required for performing open circuits test for the other isolation devices. Accordingly, in the system 510 shown in FIG. 2, a full test cycle could comprise:

lowering the supply voltage of the power supply 512 by an amount $V_D/2$ while increasing the supply voltage of power supply 514 by an amount $V_D/2$;

performing short circuit tests on the isolation devices 520 and 524 while also performing open circuit tests on the isolation devices 522 and 526;

reversing the voltage conditions such that the output voltages of the power supplies 512 and 514 are increased/decreased to a value $V_D/2$ above/below its normal operational value ($V_S$) respectively;

performing short circuit tests on the isolation devices 522 and 526 while also performing open circuit tests on the isolation devices 520 and 524;

reporting to an alarm system if a fault is detected.

Similar considerations can apply to systems comprising three or more power supply units (for example that shown in FIG. 3). By way of example, a shortened test procedure for the system 510 shown in FIG. 3 may comprise:

- lowering the supply voltage of the power supply 512 by an amount $V_D/2$ while increasing the supply voltages of the power supplies 514 and 590 by an amount $V_D/2$;
- performing short circuit tests on the isolation devices 520 and 524 while also performing open circuit tests on the isolation devices 522, 526 and 593, 594;
- altering the voltage conditions such that the output voltage of the power supply 512 is increased to a value $V_D/2$ above its normal operational value ($V_S$) while the output voltages of the power supply units 514 and 590 are decreased to a value $V_D/2$ below their normal operational value ($V_S$);
- performing open circuit tests on the isolation devices 520 and 524 while performing short circuit tests on the isolation devices 522, 526 and 593, 594;
- reporting to an alarm system if a fault is detected.

Since it is possible to test more than a single device at once, the increase in the number of power supplies (and therefore isolation devices) over the system of FIG. 2 does not impact upon the number of steps required to perform a complete test cycle.

In an alternative test cycle, open circuit tests may be performed on all of the isolation devices in the system in a single step. This step would not require the altering of any of the supply voltages if it can be assumed that each power supply is providing the same normal operational voltage $V_S$ (whereby each isolation device should be forward biased). The lack of a forward current $I_F$ under such voltage conditions should be indicative of an open circuit fault. Having performed this step, the test cycle may then continue by checking each individual set of isolation devices for short circuits in the manner described above.

Figure 4:
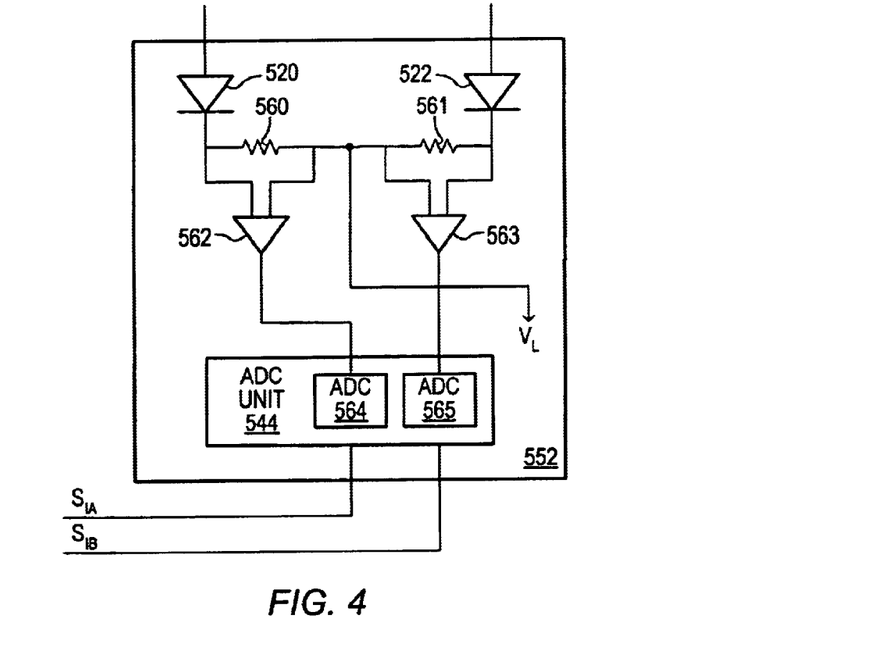
FIG. 4 shows an isolation circuit which may be provided within each of the system units in accordance with embodiments of the present invention wherein each system unit receives power from two power supplies.
Figure 5:
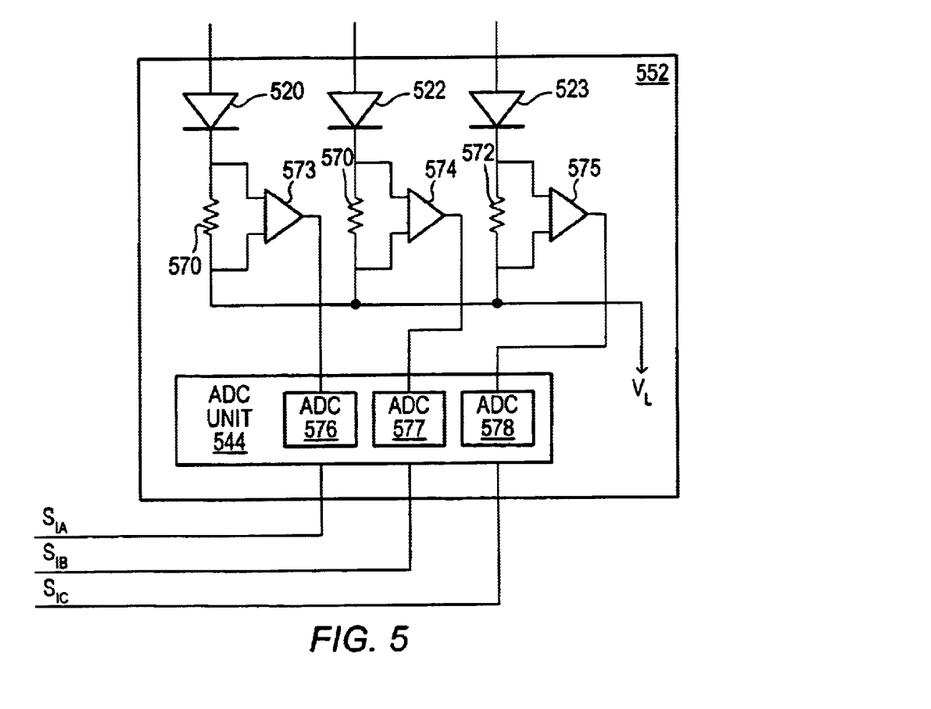
FIG. 5 shows an isolation circuit which may be provided within each of the system units in accordance with embodiments of the present invention wherein each system unit receives power from three power supplies.

Turning now to FIGS. 4 and 5, there are shown two examples of the isolation device and sensing circuit arrangement for a given system unit. In each of these embodiments, each isolation device 520, 522, 523 comprises a diode. The output of each isolation device in each system unit supplies a common load $V_L$ of that system unit. Each sensing circuit comprises a resistor arranged in parallel with a differential amplifier (see for example the resistor 560 and the differential amplifier 562 in FIG. 4). Each differential amplifier measures the voltage across a respective resistor and outputs an analogue signal indicative of that voltage. In this manner, the current flowing through each isolation device is measured. The output of each differential amplifier is supplied to the analogue to a digital converter (ADC) unit of the respective system unit.

In the embodiment shown in FIG. 4, the ADC unit 544 comprises two separate ADCs, each for performing an analogue to digital conversion of the output signal from a respective differential amplifier. The converted signals, $S_{1A}$ and $S_{1B}$ are then provided to the system controller whereby the system controller is able to monitor the currents flowing through each of the isolation devices in the system unit. In the embodiment shown in FIG. 5, the ADC unit 544 can comprises three separate ADCs (one for each differential amplifier) and thereby can produces three digital signals $S_{1A}$, $S_{1B}$ and $S_{1C}$. In alternative embodiments, the ADC unit could be provided within the system controller 550, whereby the system controller would receive analogue signals from each of the system units.

In alternative embodiments, it may be desirable to provide one of more sets of redundant isolation devices with respective sensing circuits and ADCs. This would allow the number of power supplies used in the system 510 to be altered according to need. For example, a system unit taken from the embodiment shown in FIG. 3 could be readily used in the system 510 shown in FIG. 2. Furthermore, should one isolation device or its respective sensing circuit or ADC develop a fault, an alternative isolation device could be configured to receive power.

Figure 6:
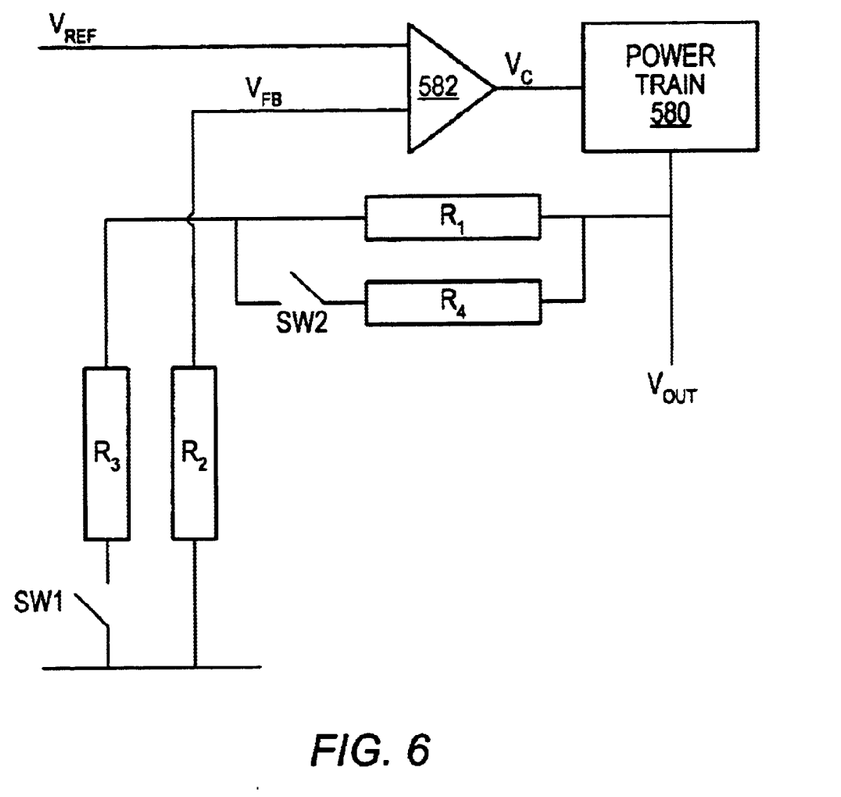
FIG. 6 shows an output level control circuit that may be provided within each power supply in the system in accordance with an embodiment of the present invention.

In FIG. 6, there is shown an embodiment of the margin arm (for example margin arm 515 in FIG. 2), which may be used in each power supply unit. The margin arm controls the output voltage of the power supply with respect to a reference voltage $V_{REF}$ in response to control signals received from control logic (516). A power train 580 has an output voltage $V_{OUT}$ which, during normal operation, is equal out voltage value $V_S$ as described above. The value of $V_{OUT}$ is controlled by control voltage $V_C$ derived from the reference voltage $V_{REF}$ via a differential amplifier 582.

A potential divider circuit provided by shunt resistance $R_1$ and $R_2$ provides a feedback input $V_{FB}$ to the differential amplifier 582 by dividing the supply voltage $V_{OUT}$ in a predetermined manner. A switch SW1 is operable to connect a shunt resistance $R_3$ in parallel with resistance $R_2$ when it is required to upwardly bias $V_{FB}$ to increase the supply voltage $V_{S1}$ by a margin. Similarly, a switch SW2 is operable to connect a shunt resistance $R_4$ in parallel with $R_1$ when it is required to reduce the supply voltage $V_{OUT}$ by a margin.

The control logic (for example control logic 516 in FIG. 2) is operable to operate switches SW1 and SW2 in response to logic signals received from the system control in order to margin up or margin down output voltage $V_{OUT}$. In this manner, the system controller is able to instruct each power supply unit to vary its output voltage to a desired level during a test cycle.

The function of the system controller 550 may be implemented in hardware or software, the software implementation requiring a processor provided with a computer program defining instructions for controlling the operation of the processor. The system controller may be operable to store values of voltage (such as the differential voltage $V_D$ or the respective bias voltages $V_B$ of the isolation devices) as well as current (including values of current passing through each isolation device under certain voltage conditions) in a look up table for comparison with values measured during the test cycle. In some implementations of the invention, the system controller itself may comprise one of the system units. The system controller would, in such embodiments, receive power from each of the power supply units in the system in the manner described above and would be operable to perform latent fault checks on its own isolation devices.

While in the embodiments described above, each of the isolation devices has been described as being essentially uniform (in terms of bias voltage and output characteristics) the invention could also be implemented in systems where isolation devices with different output characteristics are present. This would require the use of differential voltages $V_D$ in the test cycle for each isolation device. As stated above, these values could be stored by the system controller 550 in a look up table.

Each system unit can comprise electrical equipment such as a computer or different portions of a computer system. In particular, each system unit may comprise a field replaceable unit (FRU) which may be readily removed and replaced should a fault (such as those tested for in the methods described above) develop therein. Should redundant isolation devices be included in those FRUs, the FRUs could be swapped between systems comprising different numbers of power supply units. Further, should a power supply unit develop a fault, that unit (which may also comprise a FRU) may be removed without adversely affecting the test method. In such systems, the system controller may be operable to detect the number of power supply units present in the system.

In one embodiment, a system in accordance with the present invention is implemented as a blade server system that includes a rack mountable shelf that supports a plurality of power supply units and a plurality of system units in the form of server blades, the power supply units being connectable to the server blades via a midplane within the rack mountable shelf. An example of such a server blade system is described in published US application US-2003-0032335-A1 (U.S. Ser. No. 10/171,908), the whole content of which is incorporated herein by reference.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A fault test method for use in a system comprising one or more system units, wherein each system unit comprises at least two isolation devices and is powered by a plurality of redundant power supplies, each isolation device requires a forward biasing voltage at least equal to a respective forward bias voltage value to be operable in a normal conductive state and is electrically connected with a respective one of said power supplies such that each power supply has associated with it a set of one or more isolation devices, and an output of each isolation device is connected to a common load of the corresponding system unit, the method being performed by a testing system and comprising:

selecting as a subject for a test procedure, the set of isolation devices associated with a corresponding one of said power supplies;

controlling the power supplies during the test procedure to marginally vary an output voltage of at least one power supply such that a differential voltage is applied between an output of the power supply associated with the selected set of isolation devices and outputs of the remaining power supplies for selectively changing the conductive state of at least one isolation device by reducing the forward voltage thereof to less than said respective forward bias voltage;

measuring the current through each isolation device in said selected set of isolation devices; and determining whether each measured current is consistent with the existence of a fault condition in the respective isolation device.

2. The fault test method of claim 1, wherein said test procedure includes a short circuit detection test in which each of the power supplies other than the power supply associated with the selected set of isolation devices has a first output voltage greater than a second output voltage of the power supply associated with the selected set of isolation devices such that the differential voltage is applied for changing the conductive states of each isolation device of the selected set of isolation devices to a non-conductive state in the absence of a fault condition and wherein, if the measured current through any isolation devices of the selected set of isolation devices is non-zero and in a direction towards the corresponding power supply, the measured current is determined to be consistent with a short circuit fault condition in that isolation device.

3. The fault test method of claim 2, wherein said test procedure includes an open circuit detection test in which the power supply associated with the selected set of isolation devices has a first output voltage greater than a second output voltage of the remaining power supplies such that the differential voltage is applied for changing the conductive states of each of the isolation devices in sets other than the selected set of isolation devices in the absence of a fault condition and wherein, if the current measured through any of the selected isolation devices is substantially zero, the measured current is determined to be consistent with an open circuit fault condition in that isolation device.

4. The fault test method of claim 3, wherein the method comprises performing a test cycle comprising a sequence of test procedures such that in a completed test cycle respective short circuit tests and open circuit tests are performed for each of the isolation devices.

5. The fault test method as claimed in claim 4, wherein a system controller initiates a test cycle at predetermined intervals.

6. The fault test method as claimed in claim 5, including the system controller receiving and storing input data representative of the predetermined intervals and initiating the test cycle at intervals determined by the data.

7. The fault test method as claimed in claim 5, comprising the system controller generating an alarm signal in response to detection of a fault condition.

8. The fault test method of claim 5, wherein one of said system units comprises said system controller.

9. The fault test method of claim 8, wherein the common load of the system unit comprising said system controller comprises the load presented by said system controller.

10. The fault test method of claim 5, comprising the system controller outputting command signals for controlling the power supplies, each isolation device having a respective sensing circuit transmitting signals representative of the measurement of current to the system controller; and the system controller determining whether the measured currents are consistent with the existence of a fault condition.

11. The fault test method of claim 1, wherein the differential voltage is applied such that, during the test procedure and in the absence of fault conditions, the common load of each system unit is supplied by at least one of the power supplies operating at a first output voltage and being associated with a respective set of isolation devices each in a normal conductive state, and such that each remaining power supply operates at a second output voltage by the differential amount and in respect of which power supply the resulting forward voltage across each of its respective set of isolation devices is less than the forward bias voltage level of that isolation device so that conduction is inhibited.

12. The fault test method of claim 11, wherein said differential voltage is applied such that during the test procedure and in the presence of a fault condition requiring each common load to be supplied by one or more of the remaining power supplies operating at the second voltage, each resulting common load voltage is greater than a minimum operational limit required for operation of that common load.

13. The fault test method of claim 1, wherein each power supply comprises a respective margin arm input and wherein the controlling step comprises inputting a respective logic level signal to the margin arm input of the each power supply.

14. The fault test method of claim 1, wherein each isolation device comprises a respective diode.

15. The fault test method of claim 1, wherein said system comprises a computer system.

16. The fault test method of claim 1, wherein at least one system unit comprises a field replaceable unit.

17. The fault test method of claim 1, wherein each set of isolation devices is powered by the corresponding power supply via a common power bus.

18. A carrier medium carrying processor implementable instructions for instructing a processor of a testing system to perform a fault test method for use in a system comprising one or more system units, wherein each system unit comprises at least two isolation devices and is powered by a plurality of redundant power supplies, each isolation device requires a forward biasing voltage at least equal to a respective forward bias voltage value to be operable in a normal conductive state and is electrically connected with a respective one of said power supplies such that each power supply has associated with it a set of one or more isolation devices, and an output of each isolation device is connected to a common load of the corresponding system unit, the method comprising:

selecting as a subject for a test procedure, the set of isolation devices associated with a corresponding one of said power supplies;

controlling the power supplies during the test procedure to marginally vary an output voltage of at least one power supply such that a differential voltage is applied between an output of the power supply associated with the selected set of isolation devices and outputs of the remaining power supplies for selectively changing the conductive state of at least one isolation device by reducing the forward voltage thereof to less than said respective forward bias voltage;

measuring the current through each isolation device in said selected set of isolation devices; and determining whether each measured current is consistent with the existence of a fault condition in the respective isolation device.

19. A system comprising:

one or more system units, each system unit comprising at least two isolation devices, and measuring circuitry for measuring the current through isolation devices, each isolation device requiring a forward biasing voltage at least equal to a respective forward bias voltage value to be operable in a normal conductive state and having an output connected to a common load of the respective system unit;

a plurality of redundant power supplies, each supplying power for at least one system unit via an isolation device of the respective system unit such that each power supply has associated with it a set of one or more isolation devices, each power supply comprising control circuitry operable to control an output voltage of that power supply; and a system controller, operable:

to select as a subject for a test procedure, the set of isolation devices being associated with a corresponding one of said power supplies; to cause at least one power supply to marginally vary an output voltage thereof such that a differential voltage is applied between an output of the power supply associated with a selected set of isolation devices and outputs of the remaining power supplies for selectively changing the conductive state of at least one isolation device by reducing the forward voltage thereof to less than said respective forward bias voltage, and to determine whether the current measured by said measuring circuitry through each isolation device in said selected set of isolation devices is consistent with the existence of a fault condition in the respective isolation device.

20. The system of claim 19, wherein one of said system units comprises said system controller.

21. The system of claim 20, wherein the common load of the system unit comprising said system controller comprises the operational load of said system controller.

22. The system of claim 19, wherein the system controller is operable to initiate a test cycle at predetermined intervals.

23. The system of claim 22, wherein the system controller is operable to receive and store input data representative of the predetermined intervals and to initiate the test cycle at intervals determined by the data.

24. The system of claim 22, wherein the system controller is operable to generate an alarm signal in response to detection of a fault condition.

25. The system of claim 22, wherein the system controller is operable to output command signals for controlling the power supplies, each isolation device having a respective sensing circuit operable to transmit signals representative of the measurement of current to the system controller; whereby the system controller is further operable to determine whether the measured currents are consistent with the existence of a fault condition.

26. The system of claim 19, wherein each power supply comprises a respective margin arm input and wherein the output voltage of that power supply may be varied by inputting a respective logic level signal to that margin arm input.

27. The system of claim 19, wherein said system comprises a computer system.

28. The system of claim 19, wherein at least one system unit comprises a field replaceable unit.

29. The system of claim 19, wherein each isolation device comprises a respective diode.

30. The system of claim 19, wherein each set of isolation devices is powered by the corresponding power supply via a common power bus.

31. The system of claim 19, comprising a rack mountable shelf, the rack mountable shelf supporting the plurality of power supply units and a plurality of said system units in the form of server blades.

* * * * *